United States Patent
Ku et al.

(10) Patent No.: US 12,396,125 B2
(45) Date of Patent: Aug. 19, 2025

(54) REMOVABLE FAN CARTRIDGES FOR ELECTRONIC DEVICES

(71) Applicant: Intel Corporation, Santa Clara, CA (US)

(72) Inventors: Jeff Ku, Taipei (TW); Mark MacDonald, Beaverton, OR (US); Min Suet Lim, Penang (MY); Tongyan Zhai, Portland, OR (US); Shantanu D. Kulkarni, Hillsboro, OR (US); Arnab A. Sen, Bangalore (IN); Juha Paavola, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 18/200,994

(22) Filed: May 23, 2023

(65) Prior Publication Data

US 2024/0397662 A1    Nov. 28, 2024

(51) Int. Cl.
*H05K 7/20* (2006.01)
*H05K 5/02* (2006.01)
*H05K 7/14* (2006.01)

(52) U.S. Cl.
CPC ....... *H05K 7/20172* (2013.01); *H05K 5/0221* (2013.01); *H05K 7/1438* (2013.01)

(58) Field of Classification Search
CPC ...... G06F 1/203; G06F 1/1632; G06F 1/1658; G06F 1/20; G06F 1/183; H05K 7/20172; (Continued)

(56) References Cited

U.S. PATENT DOCUMENTS

| 3,401,369 A | 9/1968 | Palmateer et al. |
| 3,904,934 A | 9/1975 | Martin |

(Continued)

FOREIGN PATENT DOCUMENTS

| CN | 201226637 Y | 4/2009 |
| CN | 102045989 A | 5/2011 |

(Continued)

OTHER PUBLICATIONS

Nicky Lamarco, "The 8 Best Laptop Cooling Pads of 2023," Mar. 2, 2023, retrieved on Apr. 25, 2023, from <https://www.lifewire.com/best-laptop-cooling-pads-4149823>, 20 pages.

(Continued)

*Primary Examiner* — Michael A Matey
(74) *Attorney, Agent, or Firm* — Hanley, Flight & Zimmerman, LLC

(57) ABSTRACT

Systems, apparatus, articles of manufacture, and methods are disclosed for accessories for electronic devices and removable fan cartridges for electronic devices. An example electronic device accessory includes a backplate panel removably couplable to a first chassis of a first electronic device to replace a portion of a first cover of the first chassis and removably couplable to a second chassis of a second electronic device to replace a portion of a second cover of the second chassis. The example electronic device accessory also includes a mating device to releasably couple the backplate panel to the first chassis and independently releasably couple the backplate panel to the second chassis and a fan coupled to the backplate panel. The fan is to increase a Z height of the first electronic device when the backplate panel is coupled to the first electronic device and increase a Z height of the second electronic device when the backplate panel is coupled to the second electronic device.

19 Claims, 10 Drawing Sheets

(58) Field of Classification Search
CPC .............. H05K 7/20209; H05K 5/023; H05K 7/20136; H05K 7/20145; H05K 7/20154; H05K 5/0221; H05K 7/1438
See application file for complete search history.

(56) References Cited

U.S. PATENT DOCUMENTS

| | | | |
|---|---|---|---|
| 4,628,407 A | 12/1986 | August et al. | |
| 4,731,701 A | 3/1988 | Kuo et al. | |
| 4,860,165 A | 8/1989 | Cassinelli | |
| 4,884,168 A | 11/1989 | August et al. | |
| 5,030,113 A | 7/1991 | Wilson | |
| 5,307,519 A | 4/1994 | Mehta et al. | |
| 5,323,293 A | 6/1994 | Angiulli et al. | |
| 5,432,673 A * | 7/1995 | Ogami | G06F 1/1656 |
| | | | 439/159 |
| 5,638,895 A | 6/1997 | Dodson | |
| 5,768,104 A | 6/1998 | Salmonson et al. | |
| 5,808,870 A | 9/1998 | Chiu | |
| 5,862,037 A * | 1/1999 | Behl | G06F 1/203 |
| | | | 361/679.48 |
| 6,034,871 A * | 3/2000 | Cheng | G06F 1/203 |
| | | | 165/104.34 |
| 6,058,009 A * | 5/2000 | Hood, III | G06F 1/203 |
| | | | 361/679.55 |
| 6,072,696 A * | 6/2000 | Horii | G06F 1/203 |
| | | | 361/695 |
| 6,188,573 B1 * | 2/2001 | Urita | G06F 1/203 |
| | | | 361/679.48 |
| 6,212,071 B1 | 4/2001 | Roessler et al. | |
| 6,226,178 B1 | 5/2001 | Broder et al. | |
| 6,633,486 B2 * | 10/2003 | Coles | H05K 7/1409 |
| | | | 360/137 |
| 6,778,390 B2 | 8/2004 | Michael | |
| 6,914,782 B2 * | 7/2005 | Ku | G06F 1/203 |
| | | | 361/695 |
| 6,934,152 B1 | 8/2005 | Barrow | |
| 6,999,313 B2 * | 2/2006 | Shih | H05K 7/20172 |
| | | | 165/104.33 |
| 7,095,615 B2 | 8/2006 | Nichols | |
| 7,855,886 B1 * | 12/2010 | Chen | H05K 7/20172 |
| | | | 361/679.48 |
| 8,000,099 B2 | 8/2011 | Parker | |
| 8,693,196 B2 * | 4/2014 | Wu | G06F 1/182 |
| | | | 361/679.48 |
| 8,717,762 B2 | 5/2014 | Fujiwara | |
| 8,735,728 B2 | 5/2014 | Cheng | |
| 9,258,929 B2 | 2/2016 | Zhang et al. | |
| 9,674,986 B2 | 6/2017 | Pope et al. | |
| 9,685,598 B2 | 6/2017 | Marc | |
| 10,327,325 B2 | 6/2019 | Edlinger et al. | |
| 10,462,935 B2 | 10/2019 | Farshchian et al. | |
| 11,106,256 B2 | 8/2021 | Shu et al. | |
| 11,262,820 B1 * | 3/2022 | North | G06F 1/3296 |
| 11,262,821 B1 * | 3/2022 | North | G06F 1/3296 |
| 11,507,156 B2 | 11/2022 | He et al. | |
| 2002/0185259 A1 | 12/2002 | Park | |
| 2003/0202306 A1 | 10/2003 | Dubhashi | |
| 2003/0227443 A1 * | 12/2003 | Kyouzuka | G06F 1/1632 |
| | | | 345/156 |
| 2004/0163795 A1 | 8/2004 | Lin | |
| 2005/0207113 A1 | 9/2005 | Tanaka et al. | |
| 2005/0270711 A1 | 12/2005 | Marholev | |
| 2006/0007145 A1 | 1/2006 | Naghi | |
| 2006/0082966 A1 * | 4/2006 | Lev | G06F 1/203 |
| | | | 361/679.48 |
| 2006/0109619 A1 * | 5/2006 | Ito | G06F 1/1626 |
| | | | 361/679.55 |
| 2006/0152484 A1 | 7/2006 | Rolus Borgward | |
| 2007/0121292 A1 * | 5/2007 | Ariga | G06F 1/203 |
| | | | 361/695 |
| 2008/0062645 A1 | 3/2008 | Iijima | |
| 2008/0115914 A1 | 5/2008 | Yang et al. | |
| 2010/0238628 A1 * | 9/2010 | Hung | G06F 1/183 |
| | | | 361/688 |
| 2010/0310916 A1 * | 12/2010 | Coish | H01M 50/209 |
| | | | 429/100 |
| 2018/0091987 A1 * | 3/2018 | Miele | G06F 1/203 |
| 2018/0168070 A1 | 6/2018 | Ware et al. | |
| 2019/0264696 A1 | 8/2019 | Tsukamoto et al. | |
| 2021/0120699 A1 | 4/2021 | Lim et al. | |
| 2021/0191461 A1 * | 6/2021 | Jaggers | G06F 1/206 |
| 2021/0333848 A1 * | 10/2021 | Ku | G06F 1/203 |
| 2023/0022182 A1 | 1/2023 | Paavola et al. | |
| 2025/0008684 A1 * | 1/2025 | Ku | H05K 7/20172 |

FOREIGN PATENT DOCUMENTS

| | | |
|---|---|---|
| CN | 102647880 A | 8/2012 |
| CN | 102789292 A | 11/2012 |
| CN | 105867566 A | 8/2016 |
| JP | 2010140194 A | 6/2010 |
| JP | 2017146894 A | 8/2017 |

OTHER PUBLICATIONS

Alice Newcome-Beill, "Asus" new ROG 6 gaming phone is on sale in North America, retrieved on Apr. 25, 2023 from <https://www.theverge.com/2022/9/8/23342614/asus-rog-6-gaming-phone-preorder-north-america>, 3 pages.

Gordon Mah Ung, "Hands-on with HP's Spectre 13.3, the worlds thinnest laptop", PCWorld, Apr. 5, 2016, retrieved on May 22, 2023 from <https://www.pcworld.com/article/420276/hands-on-with-hps-spectre-133-worlds-thinnest-laptop.html>, 7 pages.

Aakash Goel, "The HP Spectre: What's Inside This Ultra-Thin Laptop," May 4, 2016, retrieved on May 22, 2023 from <https://www.engineering.com/story/the-hp-spectre-whats-inside-this-ultra-thin-laptop>, 9 pages.

Cooling accessory for phone, 1 page.

Cooling pad for laptop, 1 page.

European Patent Office, "European Search Report Pursuant to Rule 62 EPC," issued in connection with European Patent Application No. 23213829.7-1218 on Jun. 3, 2024, 11 pages.

"Hands-on with HP's Spectre 13.3, the world's thinnest laptop", https://www.pcworld.com/article/420276/hands-on-with-hps-spectre-1 . . . , retrieved on Apr. 25, 2023, 6 pages.

The HP Spectre: What's Inside This Ultra-Thin Laptop, https://www.engineering.com/story/the-hp-spectre-whats-inside-this-ultr, retrieved on Apr. 25, 2023, 8 pages.

Asus' new ROG 6 gaming phone is on sale in North America, https://www.theverge.com/2022/9/8/23342614/asus-rog-6-gaming-phone-preorder-north-america, retrieved on Apr. 25, 2023, 3 pages.

The 8 Best Laptop Cooling Pads of 2023, https://www.lifewire.com/best-laptop-cooling-pads-4149823,retrieved on Apr. 25, 2023, 20 pages.

International Searching Authority, "International Search Report," issued in connection with International Patent Application No. PCT/CN2018/072410, mailed on Oct. 12, 2018, 4 pages.

International Searching Authority, "Written Opinion of the International Searching Authority," issued in connection with International Patent Application No. PCT/CN2018/072410, mailed on Oct. 12, 2018, 4 pages.

International Searching Authority, "International Preliminary Report on Patentability," issued in connection with International Patent Application No. PCT/CN2018/072410, mailed on Jul. 23, 2020, 6 pages.

United States Patent and Trademark Office, "Non-Final Action" issued in U.S. Appl. No. 16/648,595, on Nov. 4, 2020 (12 pages).

United States Patent and Trademark Office, "Final Action," issued in U.S. Appl. No. 16/648,595, on Mar. 25, 2021 (16 pages).

United States Patent and Trademark Office, "Notice of Allowance," issued in U.S. Appl. No. 16/648,595, on May 10, 2021 (8 pages).

European Patent Office, "Extended European Search Report," issued in connection with European Patent Application No. 21198564.3-1007 on Mar. 1, 2022, 5 pages.

(56) References Cited

OTHER PUBLICATIONS

United States Patent and Trademark Office, "Non-Final Office Action," issued in connection with U.S. Appl. No. 17/131,166, dated Feb. 9, 2024, 10 pages.
European Patent Office, "Communication under Rule 71(3) EPC," issued in connection with European patent Application No. 21198564.3-1004, dated Mar. 12, 2024, 37 pages.
United States Patent and Trademark Office, "Non-Final Office Action," issued in connection with U.S. Appl. No. 17/132,846, dated Apr. 25, 2024, 11 pages.
United States Patent and Trademark Office, "Notice of Allowance and Fee(s) Due," issued in connection with U.S. Appl. No. 17/131,166, dated Apr. 29, 2024, 8 pages.
United States Patent and Trademark Office, "Final Office Action," issued in connection with U.S. Appl. No. 17/132,846, dated Sep. 13, 2024, 16 pages.
United States Patent and Trademark Office, "Notice of Allowance and Fee(s) Due," issued in connection with U.S. Appl. No. 17/132,846, dated Apr. 11, 2025, 10 pages.

* cited by examiner

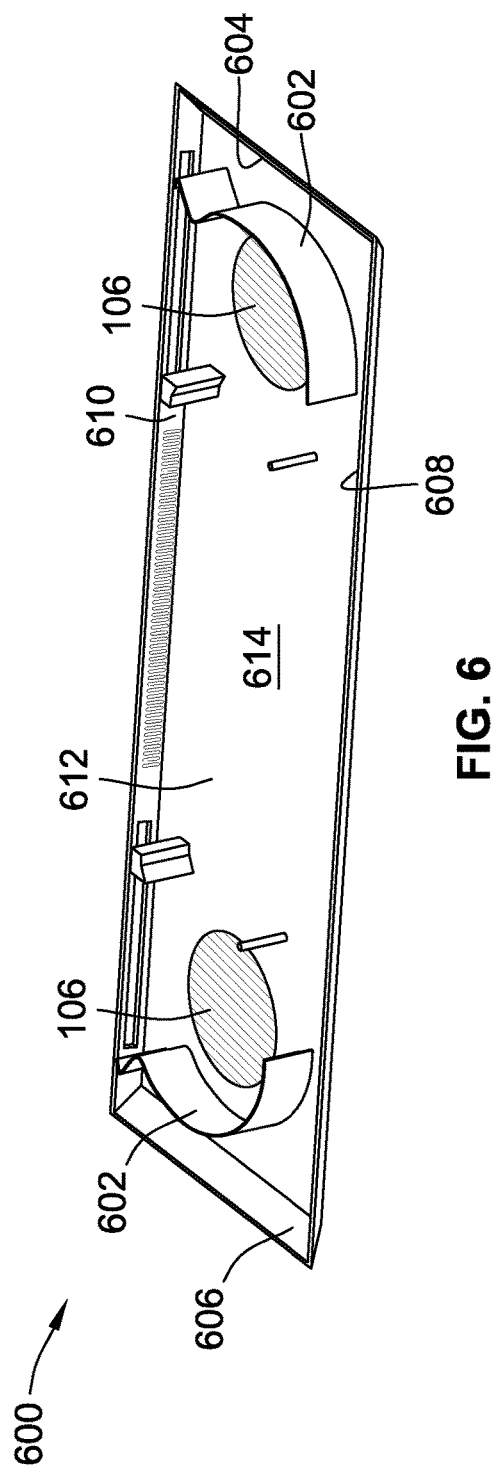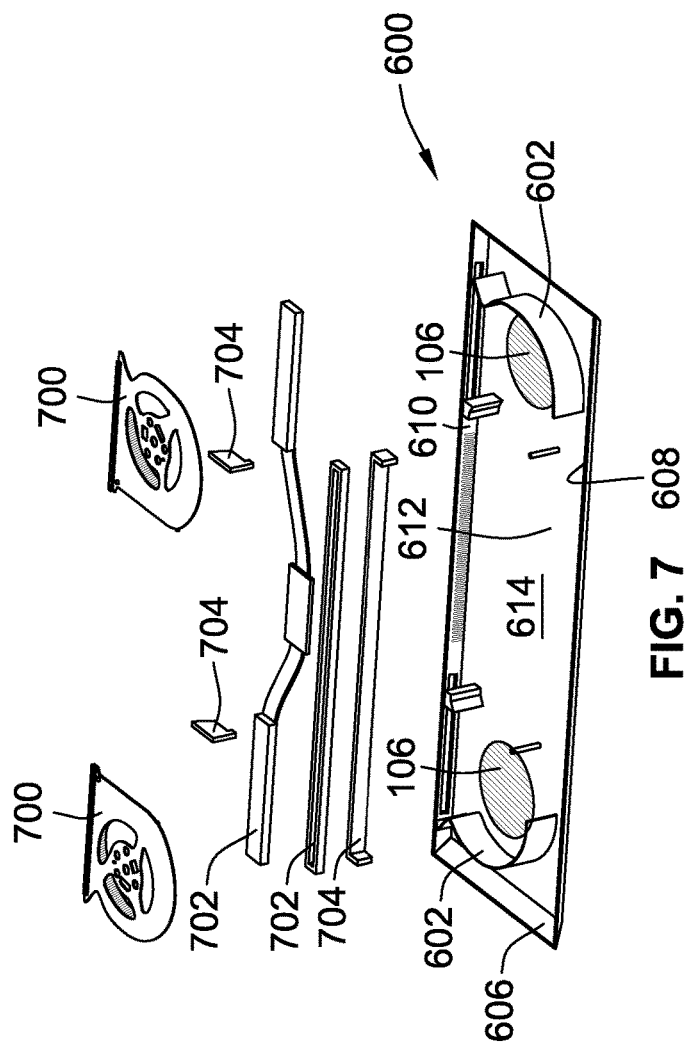

REMOVABLE FAN CARTRIDGES FOR ELECTRONIC DEVICES

FIELD OF THE DISCLOSURE

This disclosure relates generally to thermal solutions for electronic devices and, more particularly, to removable fan cartridges for electronic devices.

BACKGROUND

Many electronic devices are cooled with fans. The cooling capability of the electronic devices is dependent on the size of the fan.

BRIEF DESCRIPTION OF THE DRAWINGS

FIG. 6 is a perspective view of an example fan cartridge cover.

FIG. 7 is an exploded view of the example fan cartridge cover of FIG. 6 with example auxiliary heat dissipation components.

In general, the same reference numbers will be used throughout the drawing(s) and accompanying written description to refer to the same or like parts. The figures are not necessarily to scale. Instead, the thickness of the layers or regions may be enlarged in the drawings.

DETAILED DESCRIPTION

Electronic devices such as, for example, laptop computers and personal computers (PCs), increasingly include more heat generating components as the electronic devices become more powerful and versatile. Thermal solutions to cool the electronic devices are important to maintain target or desired operational parameters and avoid overheating. One example thermal solution includes fans to generate air flow to exhaust warm air from electronic devices.

The thickness of an electronic device is known as system Z height or simply Z height. In some electronic devices such as, for example, laptops, the Z height is a challenging factor in designing laptops. Thin laptops are desirable consumer products. However, on modern laptops the thickest key component inside the system base is the fan. The cooling or thermal dissipation capability and noise level of such laptops are highly dependent on the fan height. If the base Z height of the electronic device is limited, the fan height and cooling capability could be directly affected because the fan height and, thus, fan power is constrained by the Z height of the electronic device.

Prior efforts to increase cooling or thermal dissipation capacity of electronic devices include fan-based accessories that clip onto smartphones or cooling pads for laptop computers. However, these solutions have deficiencies. Smartphone clip accessories may only cool the skin of the back of the phone because the air flow from the fans in the clip accessories do not contact the heat source. In addition, the glass or metal chassis that are common with smartphones blocks effective cooling of the heat generating components inside the smartphone. Also, cooling pads for laptop computers are not customized for specific models, the cooling capability of cooling pads is limited, and the cooling pads cannot be moved out of the way away during usage.

Examples disclosed herein introduce removable fan cartridges that can be removed and swapped out (i.e., replaced) with alternative fan cartridges to enhance the thermal solutions to electronic devices. Examples disclosed herein may be implemented in electronic devices with evacuative cooling and/or with cooling with hyperbaric chambers, though hyperbaric flow architecture is described more frequently in this disclosure. With the examples disclosed herein, the cooling capabilities of electronic devices such as, for example, thin laptops are not limited by the fan height. Users could easily swap the fan cartridge from a cartridge with relatively less powerful fans to a cartridge with relatively more powerful fans to enhance the cooling capability of the electronic device, and/or users can swap the fan cartridge from a cartridge with relatively more powerful fans to a cartridge with relatively less powerful fans to run the electronic device at lower noise level.

Figure 1:
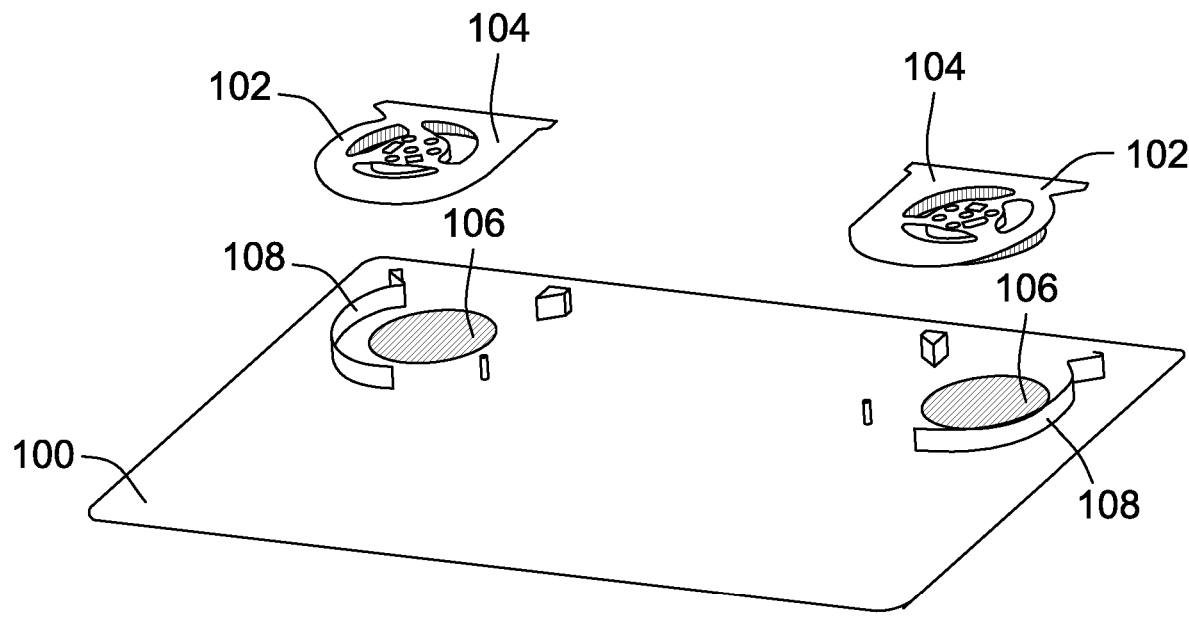
FIG. 1 is an exploded view of an example cover of an example electronic device and example fans.

FIG. 1 is an exploded view of an example cover 100 of an example electronic device and example fans 102. In some examples, the cover 100 forms part of the chassis such as, for example, a D cover of an electronic device. The fans 102 of FIG. 1 are a hyperbaric fan design. The fans 102 include an example fan base plate 104 that covers one side of the fan 102 to cover the motor and fan blade. The cover 100 includes example fan inlets 106 and example cutwaters 108 that are coupled to or formed with the cover 100. In some examples, the cover 100 includes stamped aluminum. In some examples, the cutwaters 108 include a plastic material and are bonded to the cover 100. In some examples, the plastic and aluminum parts are made separately. In such examples, different cutwater designs and/or changes in designs can be made without affecting the appearance or construction of the aluminum part.

Figure 2:
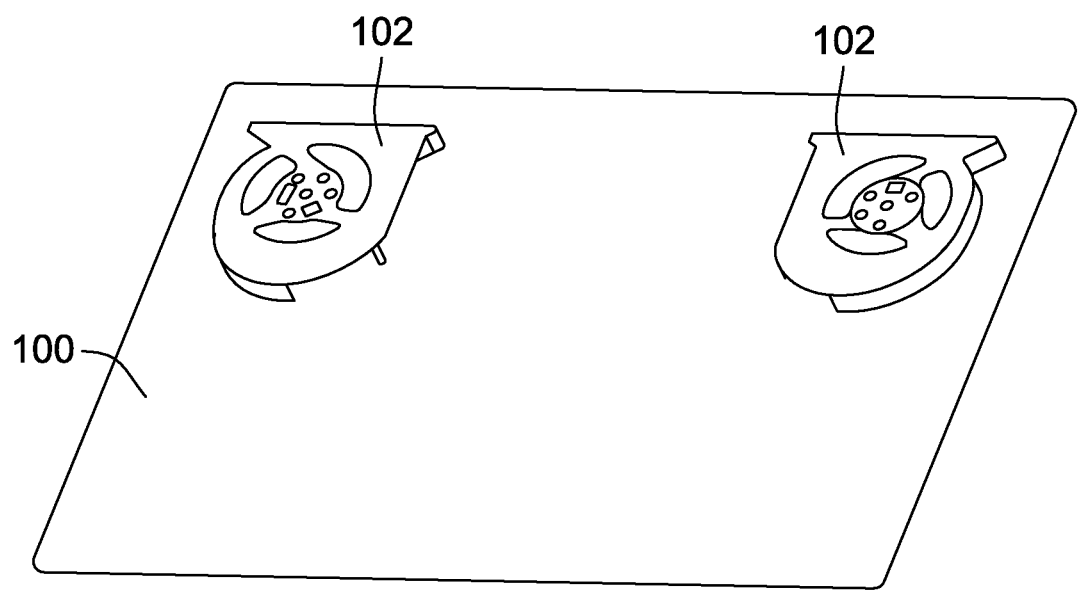
FIG. 2 is an assembled view of the cover and fans of FIG. 1.

FIG. 2 is an assembled view of the cover 100 and fans 102 of FIG. 1. In this example, there is only the base plate 104 on one side of the fans 102. Without a base plate on the other side of the fans 102, the space that would be occupied by the base plate can be used for a larger or taller fan blade in the same volume of space. Compared to regular fan designs, the hyperbaric design with on-chassis fan does not need to reserve the air gap between the D cover and the fan bottom cover. Because air is completely pumped toward the system core area with hyperbaric designs, a gap is not needed for attracting the hot air from the system core area. Therefore, at least a part of the gap could be used for increasing the fan blade height. The fan performance could be scaled directly according to an increased motor and blade thickness. Thus, in such examples, fans with larger thickness or heights and, thus, more cooling capacity, can be used. The fans 102 are removable with the cover 100. Though two fans are shown in this and other examples in this disclosure, in other examples, there may be other numbers of fans such as, for example, one, three, four, etc.

Figure 3:
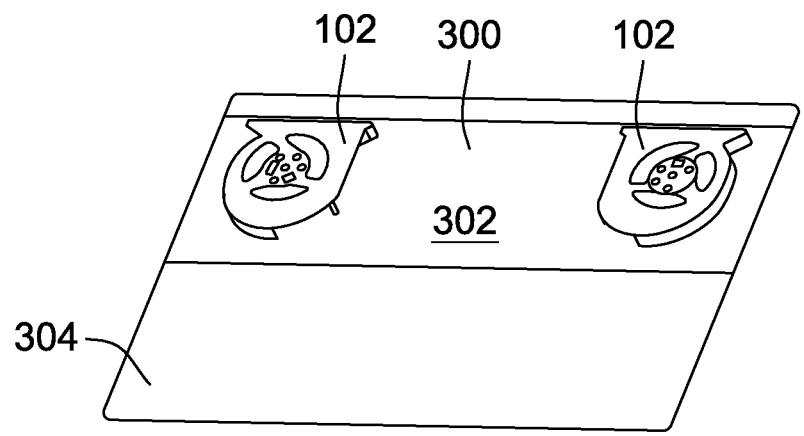
FIG. 3 is a perspective view of an example fan cartridge coupled to an example cover of an example electronic device.
Figure 4:
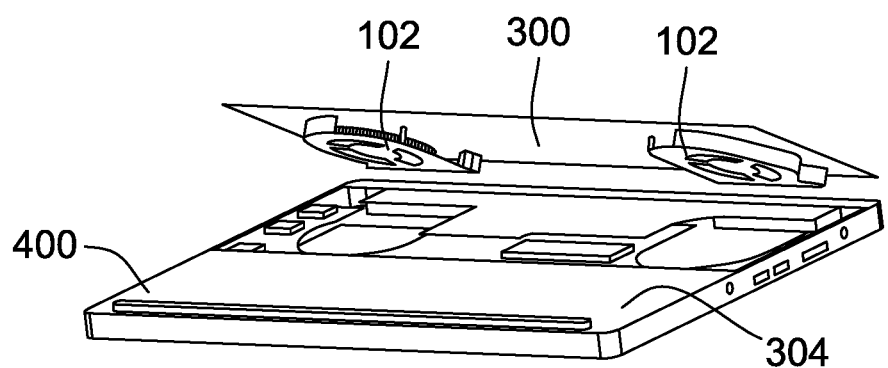
FIG. 4 is a partially exploded view of the example fan cartridge of FIG. 3 being assembled with an example electronic device.
Figure 5:
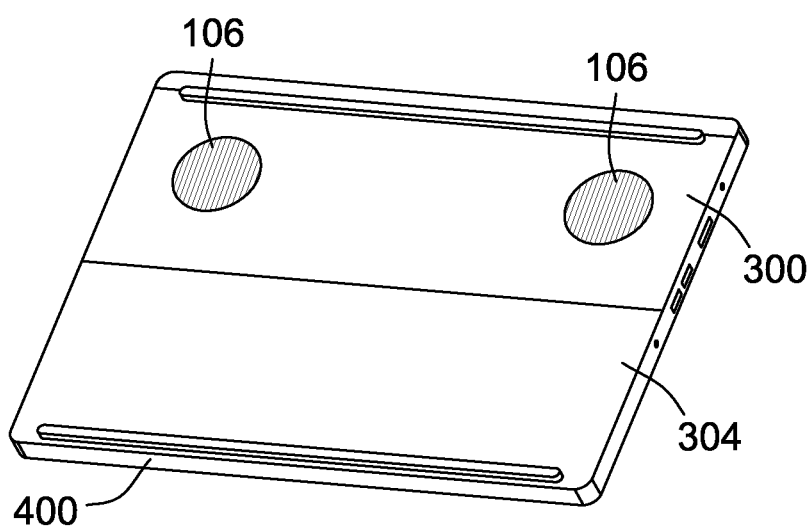
FIG. 5 is an assembled view of the fan cartridge and electronic device of FIG. 4.

FIG. 3 is a perspective view of an example fan cartridge 300 that includes a fan cartridge cover 302 to which the example fans 102 are coupled. The fan cartridge 300 is coupled to an example cover 304 of an electronic device. In this example, the fan cartridge 300 does not extend over the entire cover 304 but forms a removable portion of the cover 304. FIG. 4 is a partially exploded view of the example fan cartridge 300 of FIG. 3 being assembled with an example electronic device 400. In this example, the electronic device is a tablet or a portion of a laptop computer. FIG. 5 is an assembled view of the fan cartridge 300 and the electronic device 400. In the example of FIGS. 3-5, the fan cartridge 300 is smaller than the cover 304. Thus, a user only replaces a portion of the area of the cover 304 when removing and replacing the fan cartridge 300. For example, the fan cartridge 300 can be replaced with a fan cartridge with small fans for less noise. Alternatively, the fan cartridge 300 can be replaced with a fan cartridge with larger fans for more cooling capability and higher performance.

FIG. 6 is a perspective view of an example fan cartridge cover 600. The fan cartridge cover 600 includes the fan inlets 106. In some examples, the fan inlets 106 may have a different shape or dimension than shown (e.g., the fan inlets 106 can form a larger diameter than shown in FIG. 1). The fan cartridge cover 600 also includes example cutwaters 602. In some examples, the fan cartridge cover 600 includes aluminum and the cutwaters 602 are a plastic material bonded to the fan cartridge cover 600. The cutwaters 602 have a higher Z height to accommodate larger fans than the example of FIG. 1. The fan cartridge cover 600 includes an example first wall 604, an example second wall 606 opposite the first wall 604, an example a third wall 608 extending between the first wall 604 and the second wall 606, and example fourth wall 610 opposite the third wall 608. The fan cartridge cover 600 also includes an example backplate 612 that extends between the first wall 604, the second wall 606, the third wall 608, and the fourth wall 610. In the illustrated examples, the cutwaters 602 are coupled to the backplate 612. Also, in the illustrated examples, the fan inlets 106 are formed in the backplate 612. An example cavity 614 is formed by the first wall 604, the second wall 606, the third wall 608, the fourth wall 610, and the backplate 612. The fan cartridge cover 600 with the cavity 614 can house a taller fan than a fan cartridge cover that does not include the cavity 314. Thus, the fan cartridge cover 600 can accommodate a fan with higher performance capabilities than the fans 102 of FIG. 1.

FIG. 7 is an exploded view of the example fan cartridge 600 with example fans 700 and example auxiliary or additional heat dissipation components 700. Because of the cavity 614, the fans 700 can be high performance fans. In other words, the fans 700 can have a higher Z height, taller blades, larger motor, and can produce a larger air flow output for greater cooling or thermal dissipation capability than the fans 102 of FIG. 1.

In some examples, the fan cartridge 600 includes the additional heat dissipation components 702 beyond the fans 700. For example, within the cavity 614, the fan cartridge 600 can house or support one or more heat dissipation components. In some examples, the heat dissipation components include one or more of a heat pipe, a heat sink, and/or a vapor chamber (VC). The heat dissipating components are coupled within the fan cartridge 600 via example sealing gaskets 704. The dissipation components 702 are able to conduct additional heat from the heat generating components of the electronic device and share the thermal load of the fans 700.

Figure 8:
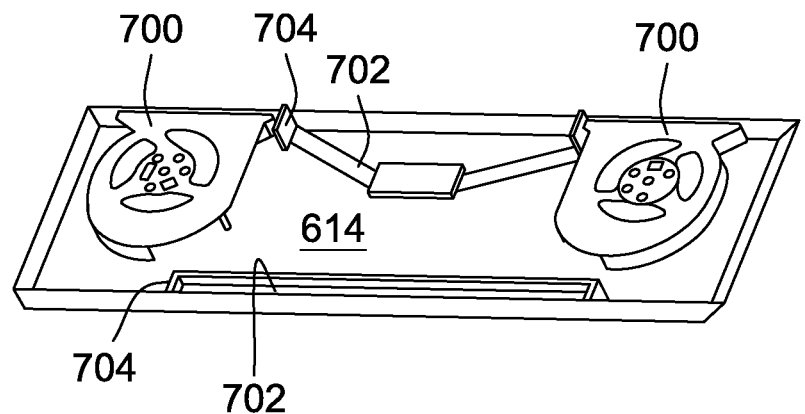
FIG. 8 is an assembled view of the fan cartridge and auxiliary heat dissipation components of FIG. 7.
Figure 9:
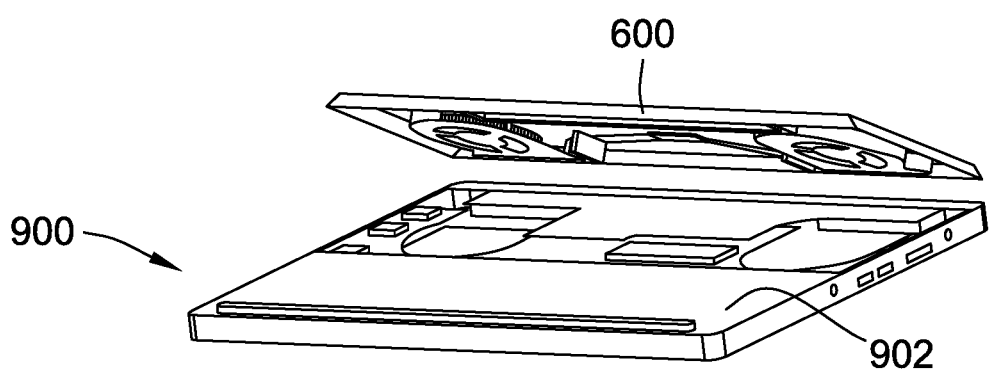
FIG. 9 is a partially exploded view of the example fan cartridge of FIG. 8 being assembled with an example electronic device.
Figure 10:
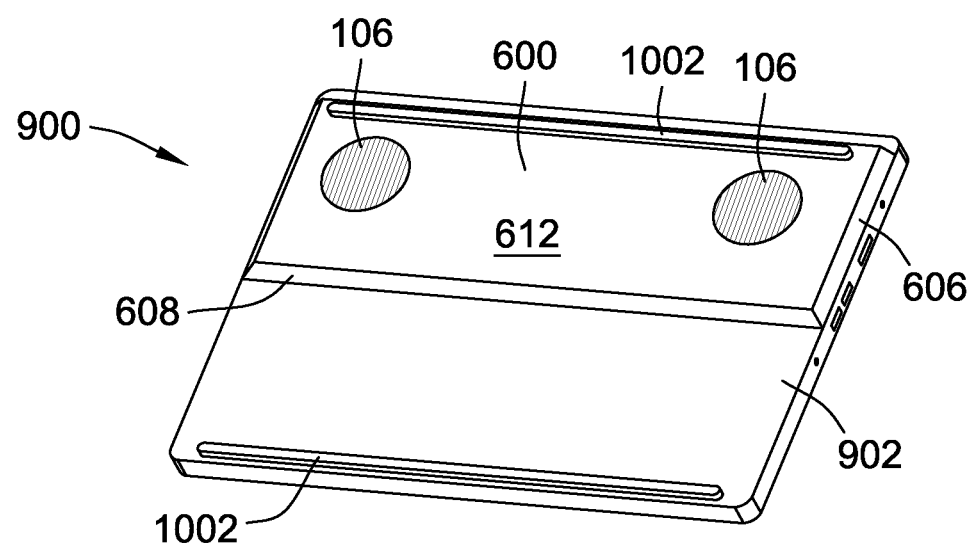
FIG. 10 is an assembled view of the fan cartridge and electronic device of FIG. 9.

FIG. 8 is an assembled view of the fan cartridge 600 with the fans 700 and the heat dissipation components 702 of FIG. 7 in the cavity 614. FIG. 9 is a partially exploded view of the fan cartridge 600 being assembled with an example electronic device 900 adjacent a portion of an example cover 902 of the electronic device 900. FIG. 10 is an assembled view of the fan cartridge 600 and electronic device 900 of FIG. 9. The second wall 606 and third wall 608 of the fan cartridge 600 are visible in FIG. 10. The first wall 604, the second wall 606, the third wall 608, and the fourth wall 610 add a thickness or Z height to the electronic device 900. In this example, the backplate 612 the fan cartridge 600 is in a first plane, and the cover 902 is in a second plane parallel and displaced from the first plane such that the fan cartridge 600 adds Z height to the electronic device 900 or, as shown, to a portion of the electronic device 900. The electronic device 900 include example surface support 1002 such as, for example rubber feet, to maintain support and positioning of the electronic device 900 on a surface.

Figure 11:
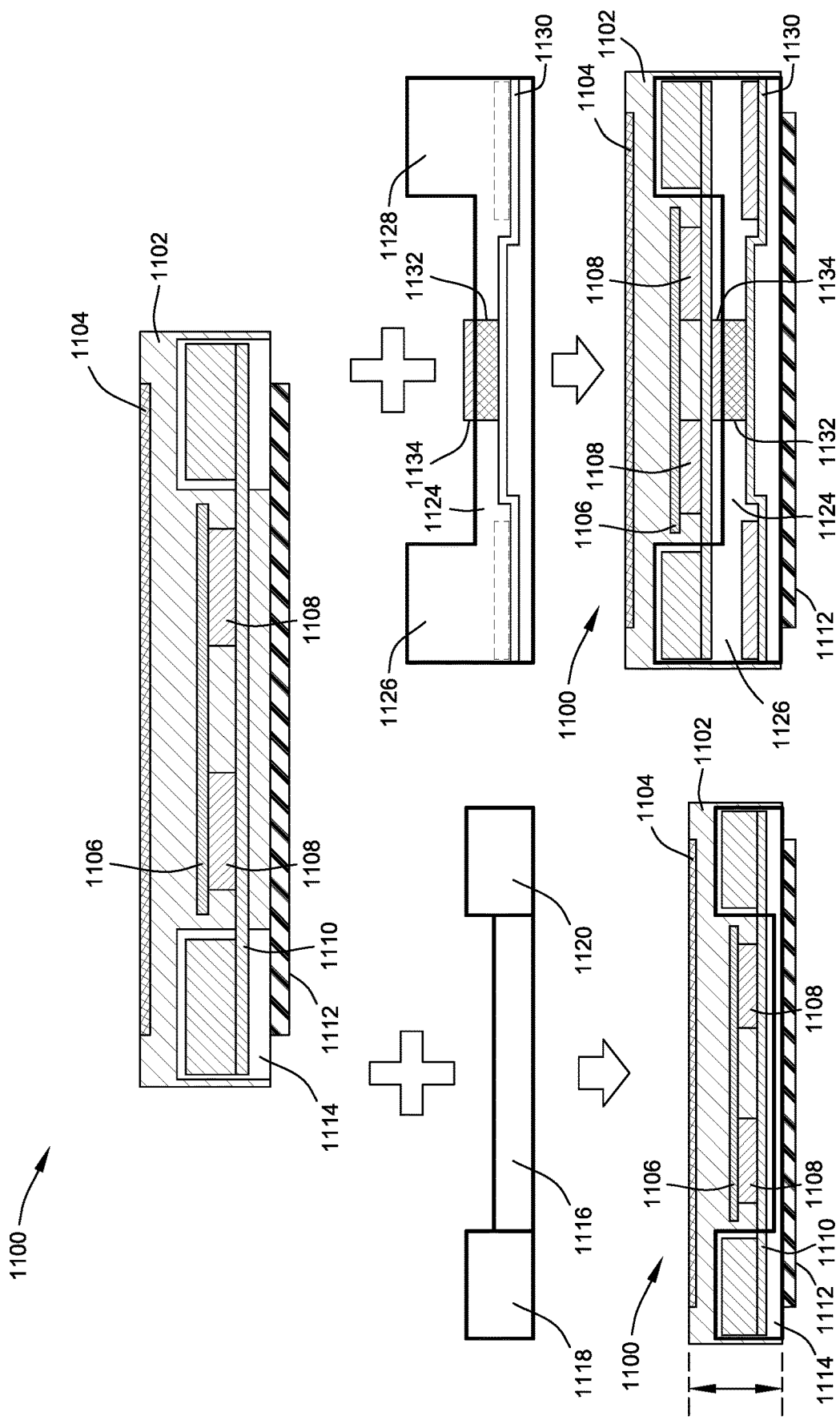
FIG. 11 is a cross-sectional comparative schematic illustration of an electronic device with two types of fan cartridges.

FIG. 11 is a cross-sectional comparative schematic illustration of an example electronic device 1100 with two types of fan cartridges that are removable from a cover of the electronic device 1100 and interchangeable. The electronic device 1100 may represent any or all of the electronic devices 400, 900 (or others disclosed herein). The electronic device 1100 includes an example chassis 1102, an example keyboard 1104, an example main printed circuit board (PCB) 1106, and one or more example heat generating components 1108 such as, for example, a central processing unit (CPU) and/or graphics processing unit (GPU). The electronic device 1100 also includes one or more example heat dissipation components 1110 such as, for example a heat pipe or VC. Also, the electronic device 1100 includes example surface support 1112 such as, for example, rubber feet.

The electronic device 1100 also includes an example pocket 1114 into which removable fan cartridges are interchangeably couplable. In the illustrated example, a first example fan cartridge 1116 includes a first example fan 1118 and a second example fan 1120. The first fan cartridge 1116 may represent the fan cartridge 300. When the first fan cartridge 1116 is combined with the chassis 1102 of the electronic device 1100, the combination has a first Z height 1122. In some examples, the Z height 1122 is approximately 9.8 millimeters (mm). In some examples, the electronic device 1100 with the first fan cartridge 1116 may form the electronic device 400 of FIGS. 4 and 5.

The first fan cartridge 1116 may be removed from the chassis 1102 and replaced with an example second fan cartridge 1124 and vice versa. The second example fan cartridge 1124 includes a third example fan 1126 and a fourth example fan 1128. The second fan cartridge 1124 may represent the fan cartridge 900. The second fan cartridge 1124 also includes an example auxiliary heat dissipation device 1130 such as, for example, a heat pipe or VC. In the illustrated example, the auxiliary heat dissipation device 1130 is couplable to the heat dissipation components 1110 via, for example, an example metal block 1132 (such as, for example, a copper block) and an example thermal pad 1134.

When the second fan cartridge 1124 is combined with the chassis 1102 of the electronic device 1100, the combination has a second Z height 1136. In some examples, the second Z height 1136 is approximately 17.8 mm. In some examples, the electronic device 1100 with the second fan cartridge 1124 may form the electronic device 900 of FIGS. 9 and 10.

The third fan 1126 and the fourth fan 1128 are larger and thicker and/or taller than the first fan 1118 and the second fan 1120. Thus, the electronic device 1100 with the second fan cartridge 1124 has higher performance characteristics than the electronic device 1100 with the first fan cartridge 1116. In some examples, the electronic device 1100 with the second fan cartridge 1124 may be used for high power computing purposes such as, for example, gaming, simulation workload, and/or lower fan acoustics at the same power level usages. In some examples, the electronic device 1100 with the first fan cartridge 1116 is suitable for lower power consumption usages and/or increased mobility.

The first fan cartridge 1116 and the second fan cartridge 1124 are removable and swappable or interchangeable. In some examples, the first fan cartridge 1116 and the second fan cartridge 1124 may be sold separately from the electronic device 1100. For example, the second fan cartridge 1124 may be sold as a performance booster kit. In some examples, the first fan cartridge 1116 and the second fan cartridge 1124 may be sold as a package for users to select and attach their preferred fan cartridge based on their usages.

Figure 12:
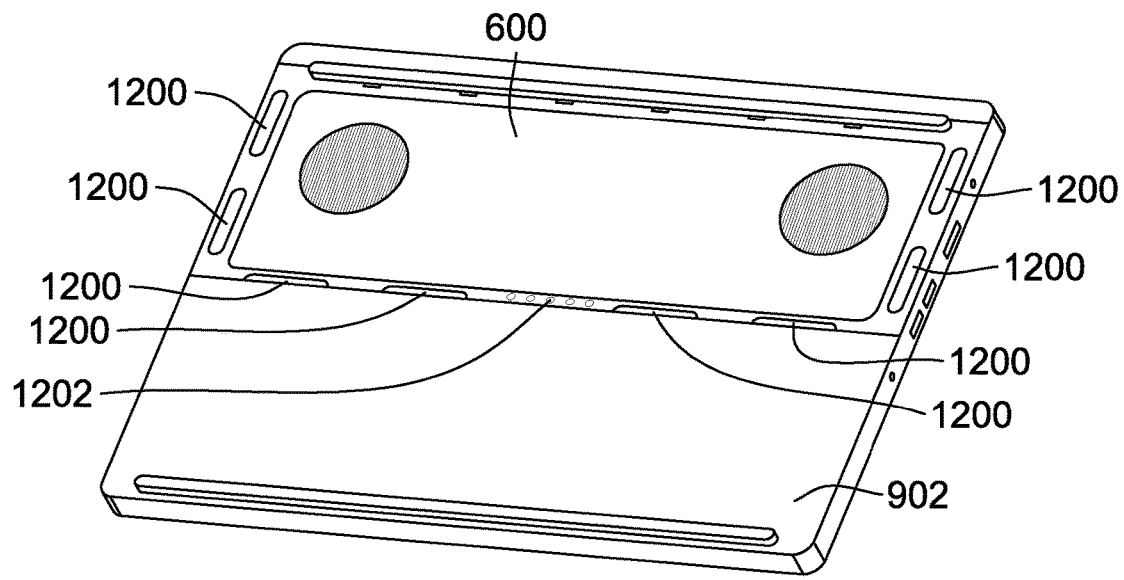
FIG. 12 is a perspective view of an electronic device with example fan cartridge connectors.

Different means or mating devices for connecting fan cartridges to electronic devices may be used. Examples disclosed herein may show means for connecting the fan cartridge 600, but the same connecting means may be used for any fan cartridge disclosed herein. FIG. 12 is a perspective view of the electronic device 900 with the fan cartridge 600 coupled thereto. The fan cartridge 600 is coupled to the electronic device with one or more magnetic connectors 1200. In the illustrated example, the magnetic connectors 1200 are positioned around the perimeter of at least three sides of the fan cartridge 600. In other examples, the magnetic connectors 1200 are positioned around fewer sides of the fan cartridge 600 or around all sides of the fan cartridge 600. In some examples, magnets of the magnetic connectors 1200 are positioned on both the fan cartridge 600 and the electronic device 900. In other examples, only one of the fan cartridge 600 or the electronic device 900 includes a magnet that is attracted to a magnetic material on the other of the fan cartridge 600 or the electronic device 900. In some examples, one or more mechanical latches are used in addition or alternative to the magnetic connectors 1200.

The fan cartridge 600 also includes example electrical connectors such as electrical pins or pogo pin probes 1202 that engage complementary pogo pads on the electronic device 900. The pogo pin probes 1202 are used to electronically couple the fan cartridge 600 to the electronic device 900 so that the fan cartridge 600 can receive instructions and power for operating the fans 700.

Figure 13:
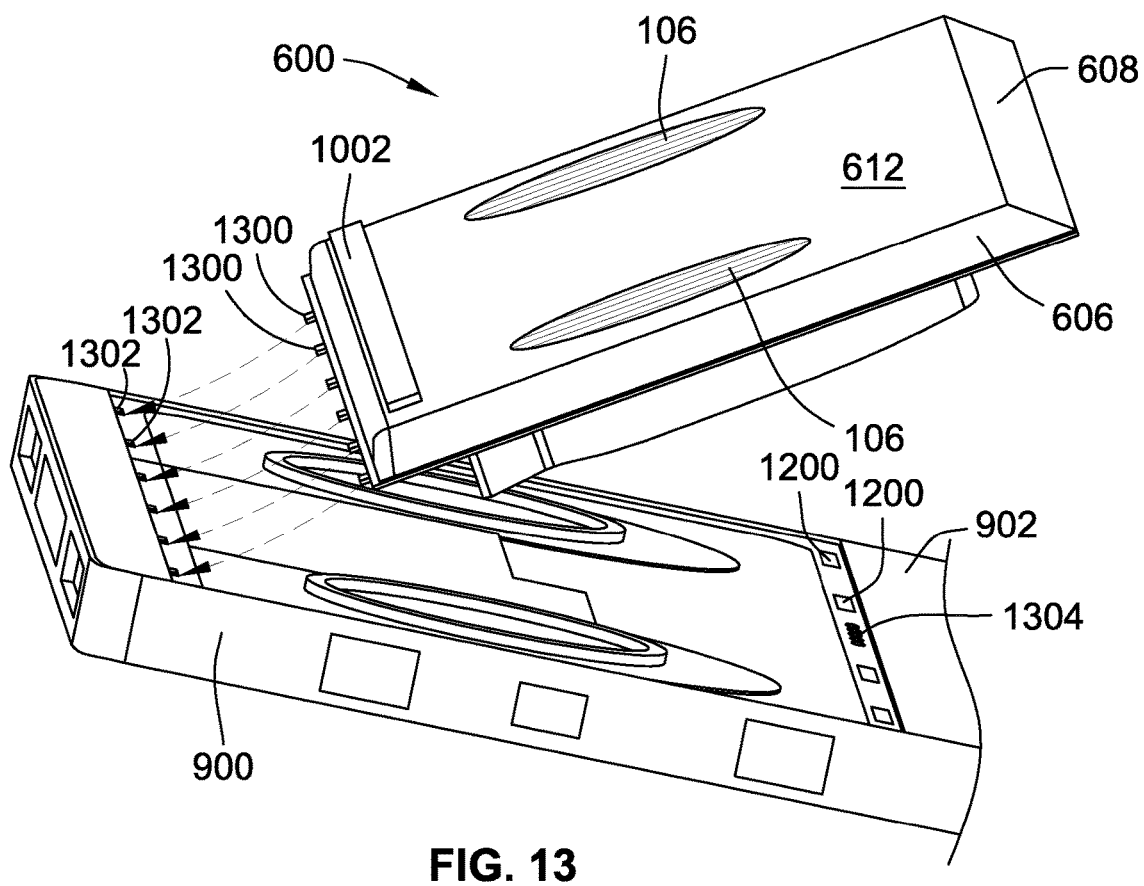
FIG. 13 is a side view of a portion of a partially assembled electronic device with example fan cartridge connectors.

FIG. 13 is a side view of a portion of the electronic device 900 partially assembled with the fan cartridge 600. The fan cartridge 600 includes mechanical connectors such as an example plurality of retention snaps 1300 that releasably engage corresponding ones of an example plurality of retention slots 1302 on the electronic device 900. In other examples, the fan cartridge 600 includes an example plurality of retention slots that are releasably engageable by corresponding ones of a plurality of retention snaps on the electronic device 900.

Figure 14:
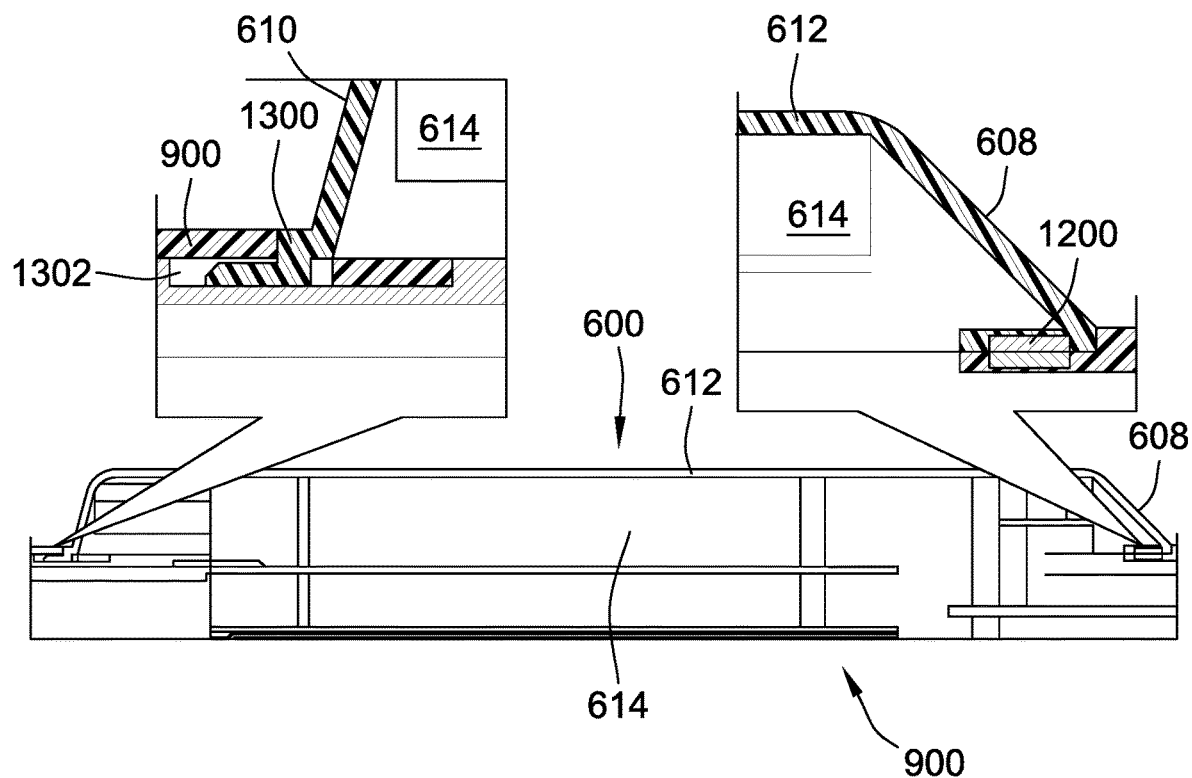
FIG. 14 is a detailed view of the example fan cartridge connectors of FIG. 13.

To assemble or attach the fan cartridge 600, the user aligns the fan cartridge 600 with the cover 902 (e.g., the D cover) of the electronic device 900. The rear edge (e.g., fourth wall 610) of the fan cartridge 600 is engaged with the electronic device 900 to cause the retention snaps 1300 to engage the retention slots 1302. The retention snaps 1300 and the retention slots 1302 form a snap feature that holds the fan cartridge 600 in place in the Z direction. The other edges of the fan cartridge 600 (e.g., the first wall 604, the second wall 606, and the third wall 608) are attached and releasably fixed to the electronic device 900 via the magnetic connectors 1200. FIG. 14 is a detailed cross-sectional view of the fan cartridge 600 coupled to the electronic device 900 with the magnetic connectors 1200, the retention snaps 1300, and the retention slots 1302. FIG. 13 also illustrates the pogo pads 1304 on the electronic device that to which respective pogo pin probes 1202 engage.

Figure 15:
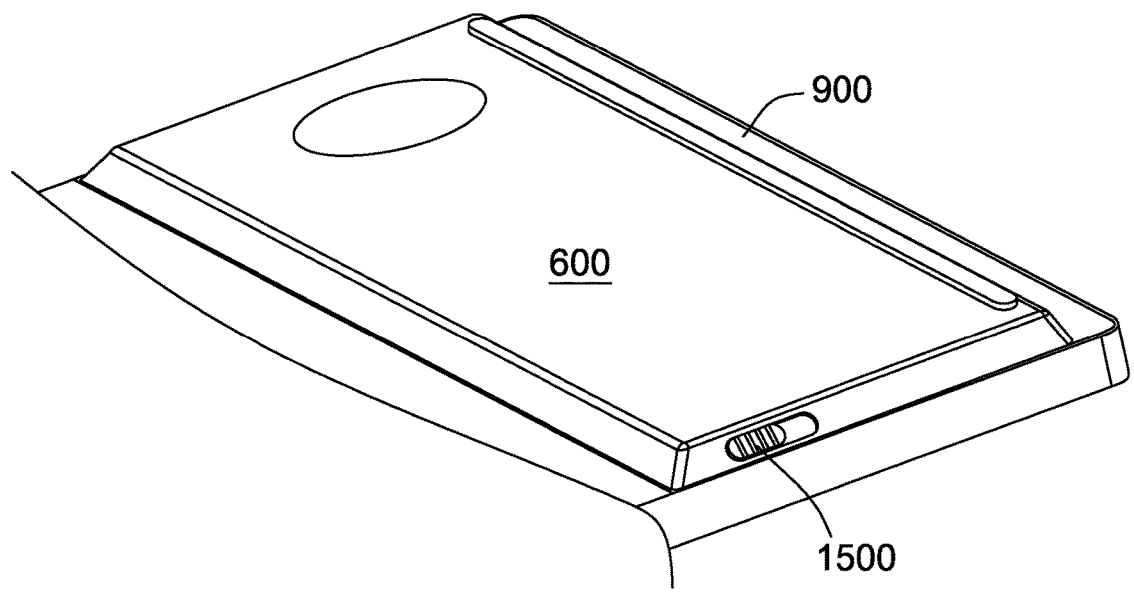
FIG. 15 is a perspective view of a portion of the electronic device of FIG. 13 with an example release mechanism for releasing the fan cartridge.

FIG. 15 is a perspective view of a portion of the electronic device 900 of FIG. 13 with an example release mechanism 1500 for releasing the fan cartridge 600. In some examples, the release mechanism 1500 is a slidable ejection knob or ejection latch. In such examples, the release mechanism 1500 includes a spring loaded latch that is engaged with a slot in the electronic device 900 in the locked position. In such examples, the spring loaded latch is retracted against the force of the spring with the slidable knob is slid, which pulls the latch from the slot and overcomes at least some of the force of the magnetic connectors 1200 to lift and separate at least a portion of the fan cartridge 600 from the electronic device 900. In some examples, the release mechanism 1500 includes a rotatable cam. In such examples, when the knob is slid, the cam rotates and presses against the electronic device, which overcomes at least some of the force of the magnetic connectors 1200 to lift and separate at least a portion of the fan cartridge 600 from the electronic device 900. In other examples, other releasable mechanisms may be used. In addition, in some examples, there may be a plurality of release mechanisms.

Figure 16:
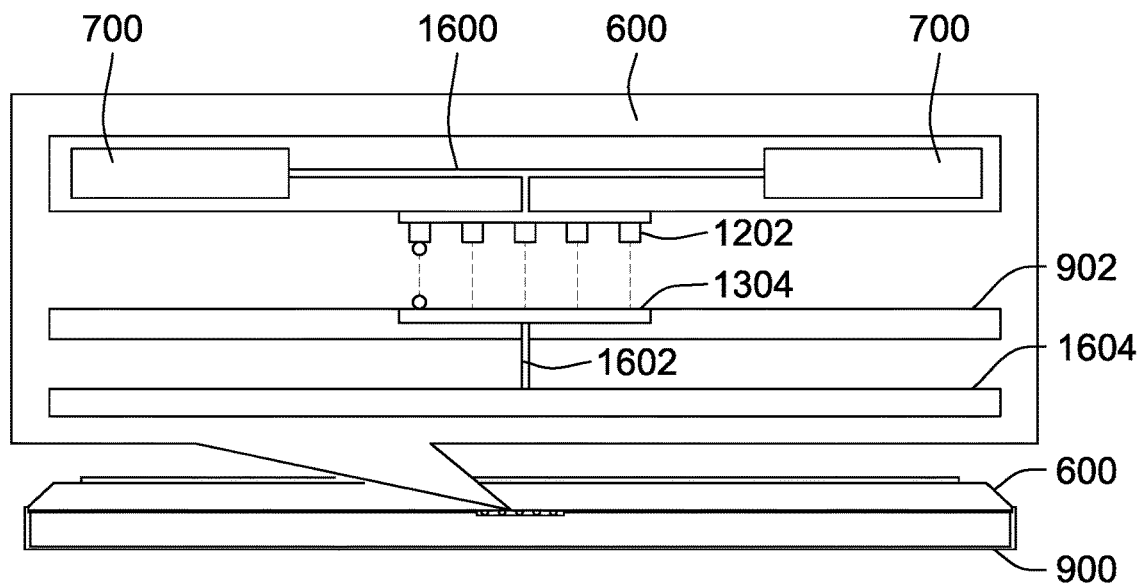
FIG. 16 is a cross-sectional schematic illustration of example internal connectors of the fan cartridge of FIG. 13.

FIG. 16 is a cross-sectional schematic illustration of example internal connectors of the fan cartridge 600 of FIG. 13. The first and second fans 700 are connected to the pogo pin probes 1202 via an example wire or flex cable 1600. The pogo pin probes 1202 engage with complementary ones of the pogo pin pads 1304. The pogo pin pads are coupled via an example wire or flex cable 1602 to an example PCB 1604.

Thus, the pogo pin probes 1202 and the pogo pin pads 1304 electrically couple the fans 700 to an example PCB 1604. With this connection, the fans 700 can receive power and operational commands. In the example of FIG. 16, the pogo pins 1202 (male side) are fixed to the fan cartridge 600, and the pogo pin pads 1304 (female side) are fixed to the base D cover 902. In other examples, the pogo pins 1202 (male side) are fixed to the base D cover 902 and coupled to the PCB 1604 via the flex cable 1602, and the pogo pin pads 1304 (female side) are fixed to the fan cartridge 600 and coupled to the fans 700 via the flex cable 1600.

Figure 17:
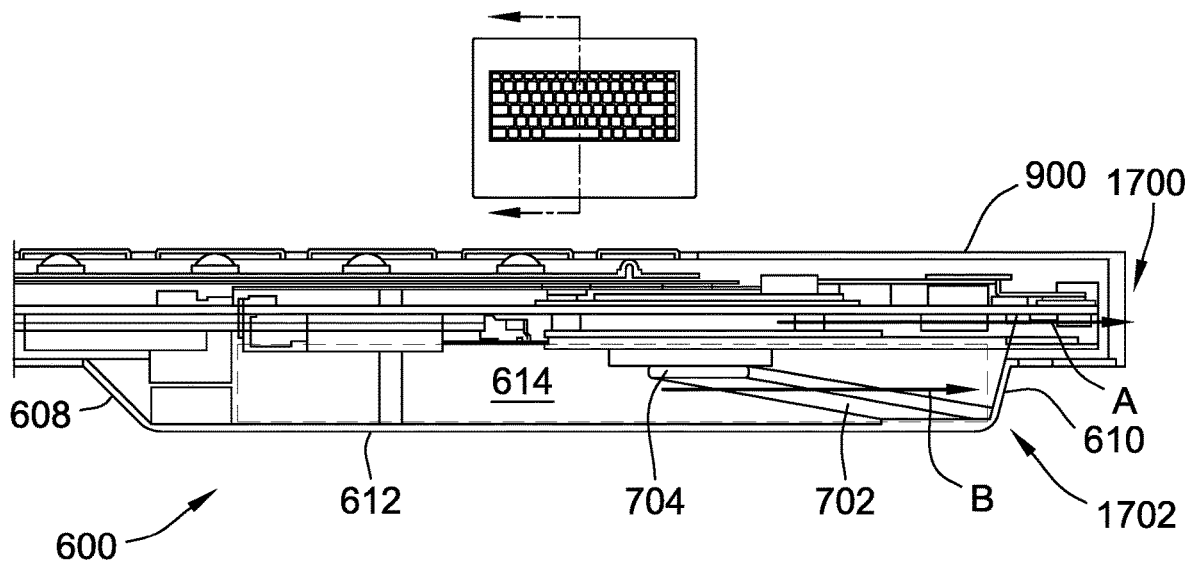
FIG. 17 is a cross-sectional view of a portion of the electronic device with the fan cartridge of FIG. 13.

FIG. 17 is a cross-sectional view of a portion of the electronic device 900 with the fan cartridge 600 of FIG. 13. The cross-sectional view illustrates the cavity 614 and the additional cooling capacity that the fan cartridge 600 adds to the electronic device 900. The cavity 614 provides an enlarged air flow chamber for the fans 700 (not shown in FIG. 17). The fans 700 expel or exhaust air from the electronic device 900 through a first exhaust area or vents 1700 on a side of the electronic device 900 as shown by the arrow A. In addition, the fans 700 expel or exhaust air from a second exhaust area or vents 1702 on the fourth wall 610 of the fan cartridge 600 as shown by the arrow B. In other examples, the first exhaust area 1700 may be included on one or more other sides of the electronic device 900 in addition or alternative to the side shown in FIG. 17. Also, in other examples, the second exhaust area 1702 may be included on or more other sides of the fan cartridge 600 in addition or alternative to the side shown in FIG. 17 (i.e., the fourth wall 610). The example of FIG. 17 also includes the heat pipe 702 that offers additional cooling capacity.

Figure 18A:
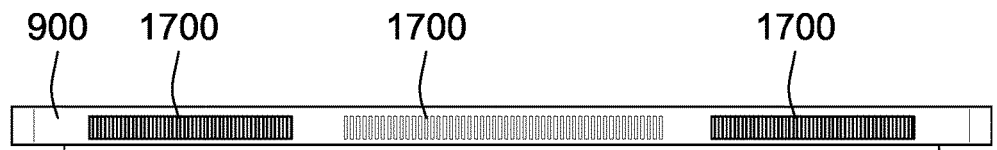
FIG. 18A is a side view of an example electronic device with a first example fan cartridge.
Figure 18B:
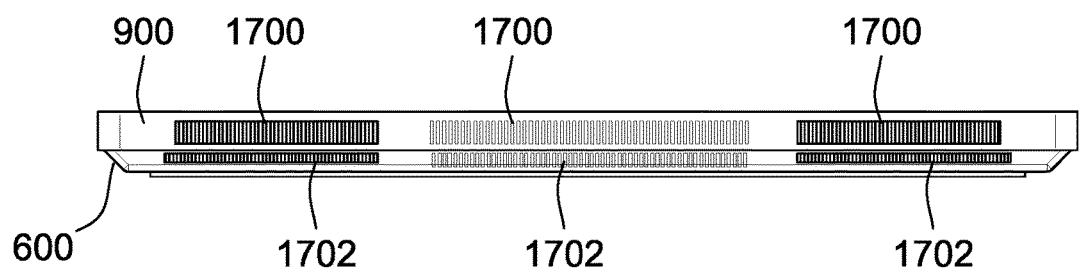
FIG. 18B is a side view of the electronic device of FIG. 18A with a second example fan cartridge.

FIG. 18A is a side view of the example electronic device with the first example fan cartridge 300. The first exhaust areas 1700 provide the openings for air to be expelled from the electronic device 900 by the fans 102. FIG. 18B is a side view of the electronic device 900 with the second example fan cartridge 600. The first exhaust areas 1700 and the second exhaust areas 1702 provide the openings for air to be expelled from the electronic device 900 by the fans 700. Thus, the electronic device 900 with the fan cartridge 600 accommodates the larger, higher performance fans 700 that can produce more air flow and more exhaust.

In some examples, the electronic device 900 with the first fan cartridge 300 is about 13.95 mm in Z height. In some examples, the electronic device 900 with the second fan cartridge 600 is about 21.95 mm in Z height.

Figure 19A:
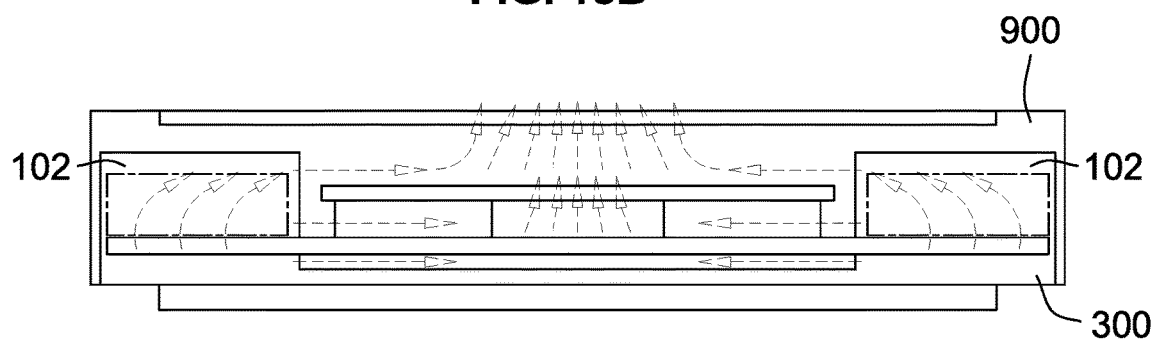
FIGS. 19A and FIG. 19B are cross-sectional schematic illustrations of example air flow through the electronic device of FIG. 18A.
Figure 19B:
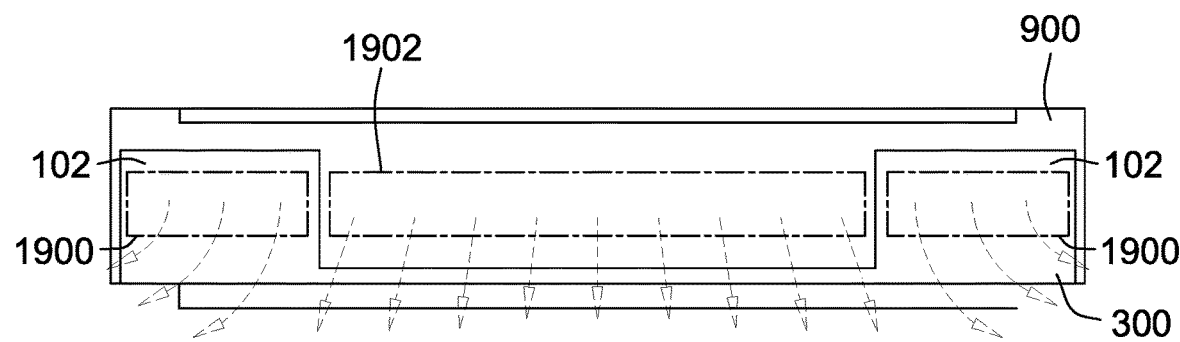

FIG. 19A and FIG. 19B are cross-sectional schematic illustrations of example air flow through the electronic device of FIG. 18A. FIG. 19A is an example front view and FIG. 19B is an example rear view. However, in other examples, the air flow can be directed through other sides of the device 900. FIG. 19A shows internal airflow through the electronic device 900. Though the electronic device 900 is described, the description applies to the electronic device 400 and/or the electronic device 1100. The electronic device 900 of FIGS. 19A and 19B includes the first fan cartridge 300 with the fans 102. Air is attracted to the fans 102 and circulated within the electronic device 900, as shown in FIG. 19A.

FIG. 19B shows the air expelled or exhausted from the electronic device 900. The air flow outlets include two fan outlets 1900 and a central chassis outlet 1902. In some examples, the two fan outlets 1900 and the central chassis outlet 1902 correspond to the first exhaust area 1700.

Figure 20A:
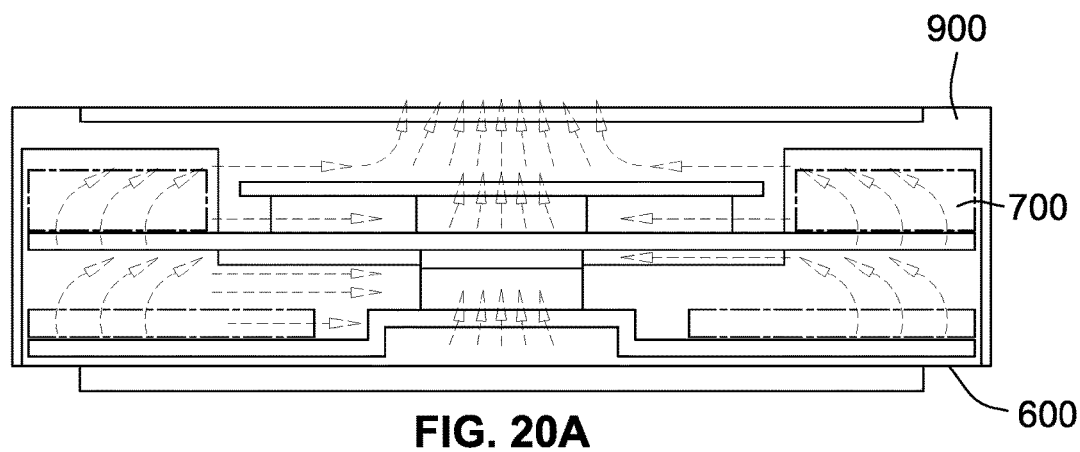
FIGS. 20A and FIG. 20B are cross-sectional schematic illustrations of example air flow through the electronic device of FIG. 18B.
Figure 20B:
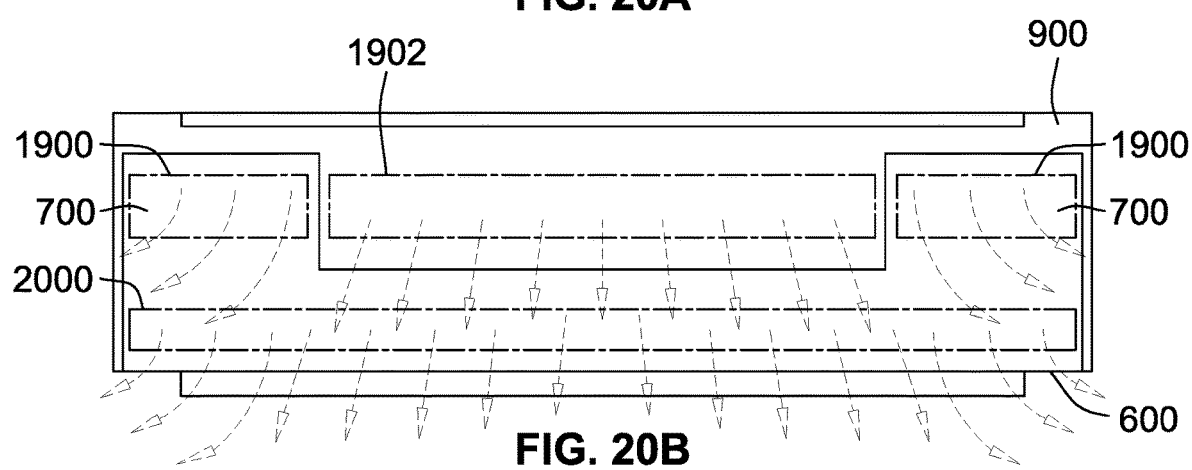

FIG. 20A and FIG. 20B are cross-sectional schematic illustrations of example air flow through the electronic device of FIG. 18B. FIG. 20A is an example front view and FIG. 20B is an example rear view. However, in other examples, the air flow can be directed through other sides of the device 900. FIG. 20A shows internal airflow through the electronic device 900. Though the electronic device 900 is described, the description applies to the electronic device 400 and/or the electronic device 1100. The electronic device 900 of FIGS. 20A and 20B includes the second fan cartridge 600 with the fans 700. Air is attracted to the fans 700 and circulated within the electronic device 900, as shown in FIG. 20A.

FIG. 20B shows the air expelled or exhausted from the electronic device 900. The air flow outlets include the two fan outlets 1900, the central chassis outlet 1902, and an example detachable fan cartridge outlet 2000. In some examples, the two fan outlets 1900 and the central chassis outlet 1902 correspond to the first exhaust area 1700, and the detachable fan cartridge outlet 2000 corresponds to second exhaust area 1702. Compared with the electronic device 900 with the first fan cartridge 300, the electronic device 900 with the second fan cartridge can exhaust a larger volume of air and increase cooling capacity.

Figure 21A:
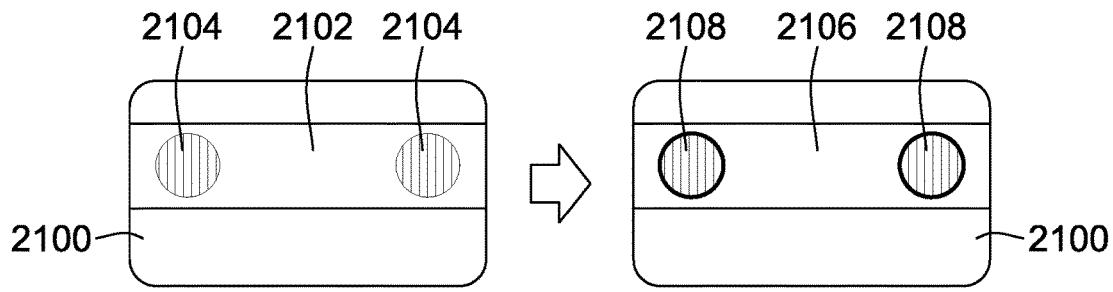
FIG. 21A is an illustration of an example chassis with a first fan cartridge and a second fan cartridge.

FIG. 21A is an illustration of an example chassis reuse, which illustrates the swappable nature of the fan cartridges disclosed herein. For example, on the left, FIG. 21A shows an example first chassis 2100 of an electronic device with a first fan cartridge 2102 having a first set of fans 2104 that have a first power capability with a first fan cartridge and a second fan cartridge. On the right, FIG. 21A shows the first fan cartridge 2102 that can be removed from the first chassis 2100 and replaced with a second fan cartridge 2106 that has a second set of fans 2108 that have a second power capability. In some examples, the second power capability is different than the first power capability. For example, the second power capability can be greater than the first power capability. Additionally or alternatively, the first fan cartridge 2102 and the first set of fans 2104 may have a first Z height. In some examples, the second fan cartridge 2106 and the second set of fans 2108 may have a second Z height. In some examples, the second Z height may be different than the first Z height. In some examples, the second Z height is greater than the first Z height. The first fan cartridge 2102 and the second fan cartridge 2106 may be interchanged to change a performance and/or a cooling capability of the electronic device.

Figure 21B:
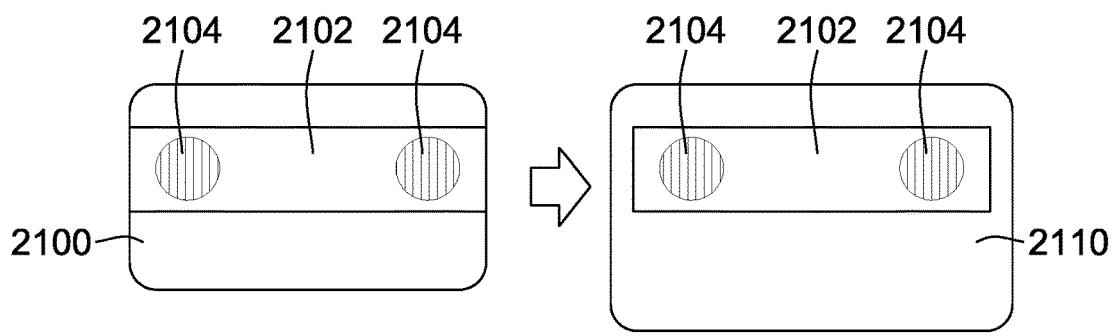
FIG. 21B is an illustration of an example fan cartridge in a first chassis and a second chassis.

FIG. 21B is an illustration of an example fan cartridge reuse. For example, on the left, FIG. 21B shows the first chassis 2100 of the electronic device with the first fan cartridge 2102 having the first set of fans 2104. On the right, FIG. 21B shows that the first fan cartridge 2102 can be removed from the first chassis 2100 and coupled to a second chassis 2110 of a second electronic device. In some examples, the first electronic device with the first chassis 2100 and the second electronic device with the second chassis 2110 are different types of devices with different form factors but that share an equivalent or substantially equivalent performance and/or cooling capability. Thus, the same fan design can be used in the different electronic devices. For example, the first electronic device with the first chassis 2100 has first exterior physical dimensions, and the second electronic device with the second chassis 2110 has second exterior physical dimensions larger than the first exterior physical dimensions.

Example removable fan cartridges disclosed herein can be used with both evacuative flow and hyperbaric flow architectures to provide a powerful performance boost accessory. There are additional benefits with hyperbaric flow architecture. For example, evacuative flow architecture relies on a heat exchanger with fins to dissipate heat. The heat exchanger fins are fixed to the heat pipes or VC and the added air flow is pushed toward the original fins with the same surface area.

Hyperbaric designs could include direct heat exchanging on the existing heat pipes and/or VCs without adding heat exchangers fins. In other words, hyperbaric designs add inbound air that effect direct heat exchanging utilizing the original heat pipes and/or VC surface and without extending or increasing the effective fins that are thermally connected to the main heat pipes and/or vapor chambers. The increased airflow is pumped directly toward the PCB board and other heat generating components and exchanges an additional amount of heat. The increased air flow generated by the thicker high performance fan cartridge goes over the chassis skin, system components, and surfaces of the thermal module and provides improved cooling capability over a fan cartridge with standard sized fans.

The ability to remove and replace fan cartridges with fan cartridges that have fans of different cooling capability allows a user to scale the cooling capability of the electronic device. In addition, examples disclosed herein enable power level scalability. For example, the package power of the CPU/GPU could be scaled with broad range by using different removable fan cartridges. For example, with the fan cartridge with standard size fans may be about 150 Watts (W). In some examples, the performance of thicker fans could boost the combined package power up to about 250 W with the additional amount of airflow.

In addition, example fan cartridges disclosed herein are stiffer than a pure D-cover of a chassis of an electronic device. Thus, the electronic device with a removable fan cartridge installed has an increased stiffness than the traditional chassis of electronic devices. For example, a traditional aluminum D-cover with a 20 Newton (N) load may deflect 0.49 mm. An aluminum D-cover with a removable fan cartridge including, for example, a fan cartridge disclosed herein, with a 20 N load may deflect 0.39 mm.

Examples disclosed herein include additional benefits such as, for example, some example cartridges with increased fan height show an increased in air flow rate with the same noise delta as fans without the increased height. In addition, the removable and swappable fan cartridges do not affect system mobility. Unlike the cooling pad solution, which is a separate part, the detachable fan cartridge solution disclosed herein is a part of the system (i.e., electronic device) after attached to the system. Thus, the fan cartridges are fully mobile with the electronic device. In addition, the swappable fan cartridge design does not just bring better performance and mobility to electronic devices (e.g., laptops), examples disclosed herein also lower the thermal solution cost and optimization efforts by leveraging the same fan cartridge on various systems. For example, the same fan cartridge can be leveraged on 14 inch, 16 inch, and 17 inch laptop designs of the same product line while maintaining consistent performance of these systems. Example fan cartridges disclosed herein also can be reused and recycled easily, which promotes better sustainability.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

From the foregoing, it will be appreciated that example systems, apparatus, articles of manufacture, and methods have been disclosed that introduce removable fan cartridges that can be removed and swapped out (i.e., replaced) with alternative fan cartridges to enhance the thermal solutions, power performance, and operation capabilities of electronic devices. Disclosed systems, apparatus, articles of manufacture, and methods improve the efficiency of using a computing device. Disclosed systems, apparatus, articles of manufacture, and methods are accordingly directed to one or more improvement(s) in the operation of a machine such as a computer or other electronic and/or mechanical device.

Example systems, apparatus, articles of manufacture, and methods are disclosed for accessories for electronic devices and removable fan cartridges for electronic devices. Example 1 includes an electronic device accessory that includes a backplate panel removably couplable to a first chassis of a first electronic device to replace a portion of a first cover of the first chassis and removably couplable to a second chassis of a second electronic device to replace a portion of a second cover of the second chassis; a mating device to releasably couple the backplate panel to the first chassis and independently releasably couple the backplate panel to the second chassis; and a fan coupled to the backplate panel, the fan to increase a Z height of the first electronic device when the backplate panel is coupled to the first electronic device and increase a Z height of the second electronic device when the backplate panel is coupled to the second electronic device.

Example 2 includes the electronic device accessory of Example 1, wherein the mating device includes a retention snap couplable to a retention slot.

Example 3 includes the electronic device accessory of either of Examples 1 or 2, wherein the mating device includes a magnet.

Example 4 includes the electronic device accessory of any of Examples 1-3 further including electrical pins to electrically couple the electronic device accessory to the first electronic device and independently to the second electronic device.

Example 5 includes the electronic device accessory of any of Examples 1-4, wherein the first electronic device has first exterior physical dimensions and the second electronic device has second exterior physical dimensions larger than the first exterior physical dimensions.

Example 6 includes the electronic device accessory of any of Examples 1-5, further including an ejection latch to release the electronic device accessory from either the first electronic device or the second electronic device.

Example 7 includes the electronic device accessory of Example 6, wherein the ejection latch is slidable.

Example 8 includes the electronic device accessory of any of Examples 1-7, wherein the backplate panel covers less than a surface area of a D cover of the first chassis.

Example 9 includes the electronic device accessory of any of Examples 1-8, wherein the fan is a first fan, the electronic device accessory further including a second fan coupled to the backplate panel.

Example 10 includes the electronic device accessory of any of Examples 1-9, further including a cutwater integrated with or coupled to the backplate panel to form a hyperbaric chamber when the electronic device accessory is coupled to the first electronic device or the second electronic device.

Example 11 includes the electronic device accessory of any of Examples 1-10 and further including a heat pipe coupled to the backplate panel.

Example 12 includes the electronic device accessory of Example 11, wherein the fan is a first fan, the electronic device accessory further including a second fan coupled to the backplate panel and the heat pipe extends between the first fan and the second fan.

Example 13 includes the electronic device accessory of any of Examples 1-12, wherein the electronic device accessory adds Z height to only a portion of the first electronic device.

Example 14 includes a fan cartridge for an electronic device, the fan cartridge including a first wall detachably couplable to a cover of an electronic device; a second wall opposite the first wall and detachably couplable to the cover; a backplate extending between the first wall and the second wall; a cavity formed by the first wall, the second wall, and the backplate; and a fan in the cavity coupled to the backplate to form a hyperbaric chamber in the cavity when the fan is coupled to the cover.

Example 15 includes the fan cartridge of Example 14, further including a plurality of mechanical connectors and at least one electrical connector to couple the electronic device fan cartridge to the electronic device.

Example 16 includes the fan cartridge of either of Examples 14 or 15, wherein the backplate is to be positioned in a first plane parallel to a second plane of the cover when coupled to the electronic device such that the electronic device fan cartridge adds Z height to a portion of the electronic device.

Example 17 includes the fan cartridge of any of Examples 14-16, wherein the fan is to increase thermal dissipation capability of the electronic device.

Example 18 includes the fan cartridge of any of Examples 14-17, wherein the electronic device fan cartridge is to increase processing power of the electronic device.

Example 19 includes the fan cartridge of any of Examples 14-18, wherein the fan is a first fan, the electronic device fan cartridge further including a second fan coupled to the backplate.

Example 20 includes the fan cartridge of any of Examples 14-19, wherein the electronic device is a first electronic device of a first form factor and the electronic device fan cartridge is removably couplable to a second electronic device of a second form factor, the second form factor different than the first form factor.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. An electronic device accessory comprising:
   a backplate panel removably couplable to a first chassis of a first electronic device to replace a portion of a first cover of the first chassis and removably couplable to a second chassis of a second electronic device to replace a portion of a second cover of the second chassis;
   a mating device to releasably couple the backplate panel to the first chassis and independently releasably couple the backplate panel to the second chassis;
   a fan coupled to the backplate panel, the fan to increase a Z height of the first electronic device when the backplate panel is coupled to the first electronic device and increase a Z height of the second electronic device when the backplate panel is coupled to the second electronic device; and
   a cutwater integrated with or coupled to the backplate panel to form a hyperbaric chamber when the electronic device accessory is coupled to the first electronic device or the second electronic device.

2. The electronic device accessory of claim 1, wherein the mating device includes a retention snap couplable to a retention slot.

3. The electronic device accessory of claim 1, wherein the mating device includes a magnet.

4. The electronic device accessory of claim 1, including electrical pins to electrically couple the electronic device accessory to the first electronic device and independently couple the electronic device accessory to the second electronic device.

5. The electronic device accessory of claim 1, wherein the first electronic device has first exterior physical dimensions and the second electronic device has second exterior physical dimensions larger than the first exterior physical dimensions.

6. The electronic device accessory of claim 1, including an ejection latch to release the electronic device accessory from either the first electronic device or the second electronic device.

7. The electronic device accessory of claim 6, wherein the ejection latch is slidable.

8. The electronic device accessory of claim 1, wherein the backplate panel covers less than a surface area of a D cover of the first chassis.

9. The electronic device accessory of claim 1, wherein the fan is a first fan, the electronic device accessory including a second fan coupled to the backplate panel.

10. The electronic device accessory of claim 1, including a heat pipe coupled to the backplate panel.

11. The electronic device accessory of claim 10, wherein the fan is a first fan, the electronic device accessory including a second fan coupled to the backplate panel and the heat pipe extends between the first fan and the second fan.

12. The electronic device accessory of claim 1, wherein the electronic device accessory adds Z height to only a portion of the first electronic device.

13. A fan cartridge for an electronic device, the fan cartridge comprising:
    a first wall detachably couplable to a cover of an electronic device;
    a second wall opposite the first wall and detachably couplable to the cover;
    a backplate extending between the first wall and the second wall;
    a cavity formed by the first wall, the second wall, and the backplate; and
    a fan in the cavity coupled to the backplate to form a hyperbaric chamber in the cavity when the fan is coupled to the cover.

14. The fan cartridge of claim 13, including a plurality of mechanical connectors and at least one electrical connector to couple the electronic device fan cartridge to the electronic device.

15. The fan cartridge of claim 13, wherein the backplate is to be positioned in a first plane parallel to a second plane of the cover when coupled to the electronic device such that the electronic device fan cartridge adds Z height to a portion of the electronic device.

16. The fan cartridge of claim 13, wherein the fan is to increase thermal dissipation capability of the electronic device.

17. The fan cartridge of claim 13, wherein the electronic device fan cartridge is to increase processing power of the electronic device.

18. The fan cartridge of claim 13, wherein the fan is a first fan, the electronic device fan cartridge including a second fan coupled to the backplate.

19. The fan cartridge of claim 13, wherein the electronic device is a first electronic device of a first form factor and the electronic device fan cartridge is removably couplable to a second electronic device of a second form factor, the second form factor different than the first form factor.

* * * * *